(12) United States Patent
Trezza

(10) Patent No.: US 7,687,397 B2
(45) Date of Patent: Mar. 30, 2010

(54) FRONT-END PROCESSED WAFER HAVING THROUGH-CHIP CONNECTIONS

(76) Inventor: John Trezza, 12 White Oak Dr., Nashua, NH (US) 03063

( * ) Notice: Subject to any disclaimer, the term of this patent is extended or adjusted under 35 U.S.C. 154(b) by 55 days.

(21) Appl. No.: 11/696,799

(22) Filed: Apr. 5, 2007

(65) Prior Publication Data

US 2007/0281466 A1 Dec. 6, 2007

Related U.S. Application Data

(63) Continuation-in-part of application No. 11/422,551, filed on Jun. 6, 2006.

(60) Provisional application No. 60/882,671, filed on Dec. 29, 2006.

(51) Int. Cl.
*H01L 21/302* (2006.01)

(52) U.S. Cl. ............... 438/667; 438/18; 257/E21.597; 257/E21.529

(58) Field of Classification Search ............... 438/667, 438/18; 257/E21.521, E21.529, E21.597
See application file for complete search history.

(56) References Cited

U.S. PATENT DOCUMENTS

| | | | |
|---|---|---|---|
| 3,312,878 A | 4/1967 | Poch et al. | |
| 3,591,839 A | 7/1971 | Evans | |
| 3,720,309 A | 3/1973 | Weir | |
| 4,200,272 A | 4/1980 | Godding | |
| 4,452,557 A | 6/1984 | Bouwknegt et al. | |
| 4,873,205 A | 10/1989 | Critchlow et al. | |
| 4,878,611 A | 11/1989 | LoVasco et al. | |
| 4,893,174 A | 1/1990 | Yamada et al. | |
| 4,915,494 A | 4/1990 | Shipley et al. | |
| 4,967,248 A | 10/1990 | Shimizu | |
| 4,999,077 A | 3/1991 | Drake | |
| 5,089,055 A | 2/1992 | Nakamura | |
| 5,089,880 A | 2/1992 | Meyer et al. | |
| 5,090,119 A | 2/1992 | Tsuda et al. | |
| 5,100,480 A | 3/1992 | Hayafuju | |
| 5,120,597 A | 6/1992 | Takimoto et al. | |
| 5,179,043 A | 1/1993 | Weichold et al. | |
| 5,220,530 A | 6/1993 | Itoh | |
| 5,229,315 A | 7/1993 | Jun et al. | |
| 5,234,149 A | 8/1993 | Katz et al. | |

(Continued)

FOREIGN PATENT DOCUMENTS

EP 0 516 866 12/1992

(Continued)

OTHER PUBLICATIONS

International Search Report for PCT/US06/23364, dated Nov. 13, 2006.

(Continued)

*Primary Examiner*—Caridad M Everhart (57) ABSTRACT

A method involves forming vias in a device-bearing semiconductor wafer, making at least some of the vias in the device-bearing semiconductor wafer electrically conductive, and performing back-end processing the device-bearing semiconductor wafer so as to create electrical connections between an electrically conductive via and a metallization layer. An alternative method involves forming vias in a device-bearing semiconductor wafer, making at least some of the vias in the device-bearing semiconductor wafer electrically conductive, and processing the device-bearing semiconductor wafer so as to create electrical connections between an electrically conductive via and a conductive semiconductor layer.

17 Claims, 4 Drawing Sheets

U.S. PATENT DOCUMENTS

| | | |
|---|---|---|
| 5,236,854 A | 8/1993 | Higaki |
| 5,308,784 A | 5/1994 | Kim et al. |
| 5,399,898 A | 3/1995 | Rostoker |
| 5,427,834 A | 6/1995 | Sodetz |
| 5,468,655 A | 11/1995 | Greer |
| 5,470,787 A | 11/1995 | Greer |
| 5,510,655 A | 4/1996 | Tanielian |
| 5,523,628 A | 6/1996 | Williams et al. |
| 5,561,594 A | 10/1996 | Wakefield |
| 5,563,084 A | 10/1996 | Ramm et al. |
| 5,587,119 A | 12/1996 | White |
| 5,589,029 A | 12/1996 | Matsui et al. |
| 5,598,965 A | 2/1997 | Scheu |
| 5,608,264 A | 3/1997 | Gaul |
| 5,635,014 A | 6/1997 | Taylor |
| 5,708,569 A | 1/1998 | Howard et al. |
| 5,780,776 A | 7/1998 | Noda |
| 5,796,591 A | 8/1998 | Dalal et al. |
| 5,814,889 A | 9/1998 | Gaul |
| 5,846,464 A | 12/1998 | Hoffman |
| 5,872,338 A | 2/1999 | Lan et al. |
| 5,929,524 A | 7/1999 | Drynan et al. |
| 5,962,922 A | 10/1999 | Wang |
| 5,963,793 A | 10/1999 | Rinne et al. |
| 5,973,396 A | 10/1999 | Farnworth |
| 6,030,894 A | 2/2000 | Hada et al. |
| 6,037,665 A | 3/2000 | Miyazaki |
| 6,075,710 A | 6/2000 | Lau |
| 6,087,719 A | 7/2000 | Tsunashima |
| 6,118,181 A | 9/2000 | Merchant et al. |
| 6,135,635 A | 10/2000 | Miller et al. |
| 6,137,184 A | 10/2000 | Ikegami |
| 6,184,066 B1 | 2/2001 | Chino et al. |
| 6,188,118 B1 | 2/2001 | Sever |
| 6,207,475 B1 | 3/2001 | Lin et al. |
| 6,215,114 B1 | 4/2001 | Yagi et al. |
| 6,232,668 B1 | 5/2001 | Hikita et al. |
| 6,277,711 B1 | 8/2001 | Wu |
| 6,283,693 B1 | 9/2001 | Acello et al. |
| 6,297,072 B1 | 10/2001 | Tilmans et al. |
| 6,314,013 B1 | 11/2001 | Ahn et al. |
| 6,316,737 B1 | 11/2001 | Evans et al. |
| 6,316,786 B1 | 11/2001 | Mueller et al. |
| 6,326,115 B1 | 12/2001 | Nakanishi et al. |
| 6,335,571 B1 | 1/2002 | Capote et al. |
| 6,393,638 B1 | 5/2002 | Maccoll |
| 6,395,633 B1 | 5/2002 | Cheng et al. |
| 6,399,426 B1 | 6/2002 | Capote et al. |
| 6,410,415 B1 | 6/2002 | Estes et al. |
| 6,429,045 B1 | 8/2002 | Furukawa |
| 6,451,626 B1 | 9/2002 | Lin |
| 6,484,776 B1 | 11/2002 | Meilunas et al. |
| 6,498,089 B2 | 12/2002 | Komada |
| 6,501,185 B1 | 12/2002 | Chow et al. |
| 6,509,256 B2 | 1/2003 | Medlen et al. |
| 6,513,236 B2 | 2/2003 | Tsukamoto |
| 6,531,022 B1 | 3/2003 | Tsukahara |
| 6,544,371 B2 | 4/2003 | Senoo et al. |
| 6,551,858 B2 | 4/2003 | Kawata et al. |
| 6,555,418 B2 | 4/2003 | Kurosawa et al. |
| 6,559,540 B2 | 5/2003 | Kawashima |
| 6,576,830 B2 | 6/2003 | Nagao et al. |
| 6,577,013 B1 | 6/2003 | Glenn et al. |
| 6,583,517 B1 | 6/2003 | Jimarez |
| 6,586,090 B2 | 7/2003 | Nakagawa et al. |
| 6,590,278 B1 | 7/2003 | Behun et al. |
| 6,596,640 B1 | 7/2003 | Fishcer et al. |
| 6,599,778 B2 | 7/2003 | Pogge et al. |
| 6,617,507 B2 | 9/2003 | Mapes et al. |
| 6,617,688 B2 | 9/2003 | Ikegami et al. |
| 6,627,477 B1 | 9/2003 | Hakey |
| 6,635,960 B2 | 10/2003 | Farrar et al. |
| 6,635,970 B2 | 10/2003 | Lasky et al. |
| 6,674,647 B2 | 1/2004 | Pierson et al. |
| 6,680,540 B2 | 1/2004 | Nakano |
| 6,686,654 B2 | 2/2004 | Farrar et al. |
| 6,689,949 B2 | 2/2004 | Ortabasi |
| 6,703,555 B2 | 3/2004 | Takabayashi et al. |
| 6,704,953 B2 | 3/2004 | Fishman |
| 6,706,554 B2 | 3/2004 | Ogura |
| 6,717,045 B2 | 4/2004 | Chen |
| 6,727,582 B2 | 4/2004 | Shibata |
| 6,730,840 B2 | 5/2004 | Sasaoka et al. |
| 6,733,685 B2 | 5/2004 | Beilin et al. |
| 6,740,576 B1 | 5/2004 | Lin et al. |
| 6,756,594 B2 | 6/2004 | George et al. |
| 6,765,287 B1 | 7/2004 | Lin |
| 6,768,210 B2 | 7/2004 | Zuniga-Ortiz et al. |
| 6,770,509 B2 | 8/2004 | Halope et al. |
| 6,770,555 B2 | 8/2004 | Yamazaki |
| 6,770,822 B2 | 8/2004 | Pasternak et al. |
| 6,780,280 B2 | 8/2004 | Halterbeck et al. |
| 6,798,030 B1 | 9/2004 | Izumi et al. |
| 6,824,643 B2 | 11/2004 | Yoshimoto et al. |
| 6,838,362 B2 | 1/2005 | Mastromatteo et al. |
| 6,841,883 B1 | 1/2005 | Farnworth et al. |
| 6,844,259 B2 | 1/2005 | Cheong |
| 6,861,336 B1 | 3/2005 | Hampton |
| 6,869,856 B2 | 3/2005 | Combi et al. |
| 6,872,635 B2 | 3/2005 | Hayashi et al. |
| 6,881,609 B2 | 4/2005 | Salmon |
| 6,889,427 B2 | 5/2005 | Yee et al. |
| 6,903,443 B2 | 6/2005 | Farnworth et al. |
| 6,919,642 B2 | 7/2005 | Hsieh et al. |
| 6,929,974 B2 | 8/2005 | Ding et al. |
| 6,939,789 B2 | 9/2005 | Huang et al. |
| 6,967,307 B2 | 11/2005 | Hembree et al. |
| 6,986,377 B2 | 1/2006 | Johnson et al. |
| 6,992,824 B1 | 1/2006 | Motamedi et al. |
| 6,995,469 B2 | 2/2006 | Hatakeyama |
| 7,015,590 B2 | 3/2006 | Jeong et al. |
| 7,033,859 B2 | 4/2006 | Pendse |
| 7,053,456 B2 | 5/2006 | Matsuo |
| 7,056,813 B2 | 6/2006 | Morrow et al. |
| 7,061,104 B2 | 6/2006 | Kenny et al. |
| 7,115,505 B2 | 10/2006 | Hartwell |
| 7,135,777 B2 | 11/2006 | Bakir et al. |
| 7,141,869 B2 | 11/2006 | Kim et al. |
| 7,144,759 B1 | 12/2006 | Hilton et al. |
| 7,145,236 B2 | 12/2006 | Miura et al. |
| 7,157,310 B2 | 1/2007 | Benson et al. |
| 7,157,372 B1 | 1/2007 | Trezza |
| 7,170,183 B1 | 1/2007 | Kim et al. |
| 7,233,028 B2 | 6/2007 | Weeks et al. |
| 7,242,099 B2 | 7/2007 | Lin et al. |
| 7,262,082 B1 | 8/2007 | Lin et al. |
| 7,264,984 B2 | 9/2007 | Garabedian et al. |
| 7,271,491 B1 | 9/2007 | Akram |
| 7,294,531 B2 | 11/2007 | Hwang et al. |
| 7,300,865 B2 | 11/2007 | Hsieh et al. |
| 7,303,976 B2 | 12/2007 | Sand |
| 7,384,863 B2 | 6/2008 | Shibata |
| 7,390,735 B2 | 6/2008 | Mehrotra |
| 7,456,497 B2 | 11/2008 | Higashi |
| 7,479,659 B2 | 1/2009 | Cognetti et al. |
| 7,488,680 B2 | 2/2009 | Andry et al. |
| 7,534,722 B2 | 5/2009 | Trezza |
| 2001/0001292 A1 | 5/2001 | Bertin et al. |
| 2001/0018230 A1 | 8/2001 | Jimarez et al. |
| 2001/0033509 A1 | 10/2001 | Ahn et al. |
| 2001/0048166 A1 | 12/2001 | Miyazaki |
| 2002/0004299 A1 | 1/2002 | Schuele et al. |
| 2002/0014465 A1 | 2/2002 | Chung |
| 2002/0017399 A1 | 2/2002 | Chang et al. |

| | | |
|---|---|---|
| 2002/0027441 A1 | 3/2002 | Akram et al. |
| 2002/0053726 A1 | 5/2002 | Mikubo et al. |
| 2002/0081773 A1 | 6/2002 | Inoue et al. |
| 2002/0083525 A1 | 7/2002 | Zheng |
| 2002/0094675 A1 | 7/2002 | Kerr et al. |
| 2002/0102835 A1 | 8/2002 | Stucchi et al. |
| 2002/0104873 A1 | 8/2002 | Lee et al. |
| 2002/0127761 A1 | 9/2002 | Mottura et al. |
| 2002/0134581 A1 | 9/2002 | Figueroa et al. |
| 2003/0005569 A1* | 1/2003 | Hiatt et al. ............... 29/602.1 |
| 2003/0047799 A1 | 3/2003 | Cheever et al. |
| 2003/0049425 A1 | 3/2003 | Ono et al. |
| 2003/0052324 A1 | 3/2003 | Kimura |
| 2003/0080408 A1 | 5/2003 | Farnworth et al. |
| 2003/0085471 A1 | 5/2003 | Iijima et al. |
| 2003/0145939 A1 | 8/2003 | Ahn et al. |
| 2003/0159262 A1 | 8/2003 | Pasternak et al. |
| 2003/0183947 A1 | 10/2003 | Ohuchi |
| 2003/0206680 A1 | 11/2003 | Bakir et al. |
| 2003/0214036 A1 | 11/2003 | Sarihan et al. |
| 2003/0216030 A1 | 11/2003 | Kim et al. |
| 2003/0222354 A1 | 12/2003 | Mastromatteo et al. |
| 2004/0020040 A1 | 2/2004 | Arneson et al. |
| 2004/0029304 A1 | 2/2004 | Naydenkov et al. |
| 2004/0031517 A1 | 2/2004 | Barels |
| 2004/0051168 A1 | 3/2004 | Arai et al. |
| 2004/0077154 A1 | 4/2004 | Nagarajan et al. |
| 2004/0104791 A1 | 6/2004 | Satoh et al. |
| 2004/0124523 A1 | 7/2004 | Poo et al. |
| 2004/0126927 A1 | 7/2004 | Lin et al. |
| 2004/0177774 A1 | 9/2004 | Naitoh et al. |
| 2004/0187210 A1 | 9/2004 | Hickman |
| 2004/0192029 A1 | 9/2004 | Hartwell |
| 2004/0199998 A1 | 10/2004 | Shinner |
| 2004/0207061 A1 | 10/2004 | Farrar et al. |
| 2004/0238115 A1 | 12/2004 | Matsuno et al. |
| 2004/0245630 A1 | 12/2004 | Huang et al. |
| 2004/0256686 A1 | 12/2004 | Sassolini et al. |
| 2004/0262635 A1 | 12/2004 | Lee |
| 2005/0042838 A1 | 2/2005 | Garyainov et al. |
| 2005/0046034 A1 | 3/2005 | Farrar |
| 2005/0048766 A1 | 3/2005 | Wu et al. |
| 2005/0101054 A1 | 5/2005 | Mastromatteo et al. |
| 2005/0104027 A1 | 5/2005 | Lazarev |
| 2005/0104219 A1 | 5/2005 | Matsui |
| 2005/0121768 A1 | 6/2005 | Edelstein et al. |
| 2005/0146049 A1 | 7/2005 | Kripesh et al. |
| 2005/0163982 A1 | 7/2005 | Ono et al. |
| 2005/0167830 A1 | 8/2005 | Chang et al. |
| 2005/0184377 A1 | 8/2005 | Takeuchi et al. |
| 2005/0230804 A1 | 10/2005 | Tanida et al. |
| 2005/0233504 A1 | 10/2005 | Doi et al. |
| 2005/0245059 A1 | 11/2005 | Yuan et al. |
| 2005/0262634 A1 | 12/2005 | Gottlieb |
| 2005/0263869 A1 | 12/2005 | Tanaka et al. |
| 2005/0266670 A1 | 12/2005 | Lin et al. |
| 2006/0001174 A1 | 1/2006 | Matsui |
| 2006/0035563 A1 | 2/2006 | Kalenian et al. |
| 2006/0046468 A1 | 3/2006 | Akram et al. |
| 2006/0057836 A1 | 3/2006 | Nagarajan et al. |
| 2006/0070704 A1 | 4/2006 | Sinclair et al. |
| 2006/0073701 A1 | 4/2006 | Koizumi et al. |
| 2006/0125084 A1 | 6/2006 | Fazzio et al. |
| 2006/0128061 A1 | 6/2006 | Ravi et al. |
| 2006/0170089 A1 | 8/2006 | Mizukoshi |
| 2006/0208326 A1 | 9/2006 | Nasiri et al. |
| 2006/0223301 A1 | 10/2006 | Vanhaelemeersch |
| 2006/0228825 A1 | 10/2006 | Hembree |
| 2006/0252262 A1 | 11/2006 | Kazemi |
| 2006/0264029 A1 | 11/2006 | Heck |
| 2006/0275946 A1 | 12/2006 | MacNamara et al. |
| 2006/0278988 A1 | 12/2006 | Trezza |
| 2006/0278992 A1 | 12/2006 | Trezza et al. |
| 2006/0281303 A1 | 12/2006 | Trezza et al. |
| 2006/0281363 A1 | 12/2006 | Trezza |
| 2006/0289990 A1 | 12/2006 | Farrar |
| 2006/0292824 A1 | 12/2006 | Beyne et al. |
| 2007/0020926 A1 | 1/2007 | Kalvesten et al. |
| 2007/0096263 A1* | 5/2007 | Furukawa et al. ........... 257/621 |
| 2007/0184653 A1 | 8/2007 | Blanchard |
| 2007/0228576 A1 | 10/2007 | Trezza |
| 2007/0249093 A1 | 10/2007 | Aiba et al. |
| 2007/0278641 A1 | 12/2007 | Trezza |
| 2008/0003817 A1* | 1/2008 | Morimoto ................... 438/667 |
| 2008/0029851 A1* | 2/2008 | Kirby et al. ................. 257/621 |
| 2008/0111582 A1 | 5/2008 | Matsui et al. |
| 2008/0116567 A1 | 5/2008 | Amin et al. |
| 2008/0213941 A1 | 9/2008 | Pendse |
| 2008/0254618 A1* | 10/2008 | Umemoto et al. ........... 438/667 |
| 2008/0284037 A1 | 11/2008 | Andry et al. |

FOREIGN PATENT DOCUMENTS

| | | |
|---|---|---|
| EP | 0620701 | 10/1994 |
| EP | 0 757 386 | 2/1997 |
| EP | 1 415 950 | 5/2004 |
| EP | 1 643 819 | 4/2006 |
| JP | 2001-129800 | 5/2001 |
| JP | 2004-214423 | 7/2004 |
| JP | 2004-273596 | 9/2004 |
| WO | WO 2004/084300 | 9/2004 |

OTHER PUBLICATIONS

International Search Report for PCT/US06/23297, dated Jan. 3, 2007.
International Search Report and Written Opinion for PCT/US2006/23365 mailed on Jan. 19, 2007.
International Search Report and Written Opinion for PCT/US2006/23362 mailed on May 20, 2008.
International Search Report and Written Opinion for PCT/US2006/023250 mailed on May 19, 2008.
International Search Report and Written Opinion for PCT/US2008/053994 mailed on May 26, 2008.
International Search Report and Written Opinion for PCT/US2007/089061 mailed on Jun. 26, 2008.
International Search Report and Written Opinion for PCT/US2006/023367 mailed on Jun. 10, 2008.
Written Opinion for PCT/US2006/023297 mailed on Jan. 3, 2007.
Written Opinion for PCT/US2006/023249 mailed on Jun. 19, 2007.
Written Opinion for PCT/US2006/023364 mailed on Dec. 28, 2006.
Written Opinion for PCT/US2006/023366 mailed on Dec. 8, 2006.
Written Opinion for PCT/US2006/023361 mailed on Sep. 19, 2007.
"Fiber Optics Tutorial—Terminating Website", http://www.lanshack.com/fiber-optic-tutorial-termination.asp, accessed on Aug. 1, 2003, available from www.archive.org, 7 pages.
Topol, A.W. et al., "Enabling Technologies for Wafer-Level Bonding of 3D MEMS and Integrated Circuit Structures", Electronic Components and Technology Conference, 2004, vol. 1, Jun. 1-4, 2004, pp. 931-938.
International Search Report, PCT/US06/23361, dated Sep. 19, 2007.
International Search Report for PCT/US06/23366, dated Dec. 8, 2006.
International Search Report, PCT/US06/23249, dated Jun. 11, 2007.
International Search Report and Written Opinion for PCT/US2006/023246 mailed on Jul. 3, 2008.
International Search Report and Written Opinion for PCT/US2006/023248 mailed on Jul. 3, 2008.
International Search Report and Written Opinion for PCT/US2006/023363 mailed on Jul. 2, 2008.
International Search Report and Written Opinion for PCT/US2006/023368 mailed on Jul. 11, 2008.
International Search Report and Written Opinion for PCT/US2008/064136 mailed on Sep. 26, 2008.

Harper, Charles A.; "Electronic Packaging and Interconnection Handbook"; 2000; McGraw-Hill, Third Edition; p. 6.1.

Ex Parte Quayle issued for U.S. Appl. No. 11/688,088 mailed on Jul. 30, 2009.

Merriam-Webster Online website, <http://www.merriam-webster.com/dictionary/bounding>.

Merriam-Webster Online website, <http://www.merriam-webster.com/dictionary/bounding> printed on Apr. 10, 2009.

Chinese Office Action issued in Chinese Patent Application No. 2006800293133 dated Jul. 3, 2009.

International Preliminary Report on Patentability for PCT/US2008/064136 mailed Oct. 1, 2009.

International Preliminary Repor t on Patentability for PCT/IB2008/001429 mailed Oct. 15, 2009.

* cited by examiner

FRONT-END PROCESSED WAFER HAVING THROUGH-CHIP CONNECTIONS

CROSS REFERENCE TO RELATED APPLICATIONS

This application claims the benefit of priority, pursuant to 35 U.S.C. 119(e), of U.S. Provisional Application Ser. No. 60/882,671 filed Dec. 29, 2006, and is also a continuation-in-part of U.S. patent application Ser. No. 11/422,551 filed Jun. 6, 2006, the entirety of which are all are incorporated herein by reference as if fully set forth herein.

FIELD OF THE INVENTION

The present invention relates to semiconductors and, more particularly, to electrical connections for such devices.

BACKGROUND

It is sometimes desirable to be able to form electrical connections through a chip to facilitate connecting it to another element in an efficient manner. In many cases, this means use of vias and involve connections that are made near the devices of chips as opposed to forming connections at or near the periphery of the chip, as is done with conventional methods.

One drawback to using through-chip vias on fully processed (i.e. device-bearing) chips is that fully formed chips are significantly more expensive than the cost of a comparable piece of blank wafer or a partially processed chip. If an error is made in aligning where the via for the electrical connection will be, a device on the chip or one or more of the metallization layers may be damaged or the desired connection may not be made.

In either case, the result could be a useless chip, requiring scrapping of the chip.

SUMMARY OF THE INVENTION

We have devised a way to minimize the risk and cost associated with the use of through-chip electrical connections in conjunction with device-bearing chips.

With one type of implementation, involving forming the through-chip connections on a blank wafer, the risk of damaging devices is advantageously eliminated (because there are no devices to damage). Moreover, in the event of a problem that renders the wafer unusable, the cost effect is also reduced because the wafer has not yet undergone any device creation or back-end processing procedures.

Another type of implementation, involves forming the through chip connections on a wafer where the devices have been formed, but the back end processing to add the metal interconnect layers has not been completed. With this implementation approach, transistors that may be very sensitive to processing and need flat and extremely defect-free areas can be formed without the risk of contamination, thereby improving transistor yield while still obtaining the routing benefits because the vias can be formed before the first metal layer is deposited during a back-end process, after the first metal layer is deposited but before the second metal layer is deposited, or more generally, before depositing of any of the "n" layers that may be deposited as part of the back-end processing.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

U.S. patent application Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011, 11/556,747 and 11/422,551, incorporated herein by reference describe various techniques for forming small, deep vias in, and electrical contacts for, semiconductor wafers. Our techniques allow for via densities and placement that was previously unachievable and can be performed on a chip or wafer scale.

In cases where it is desirable to create through-chip electrical connections, but minimize the risks involved with fully processed wafers (i.e. device bearing wafers), the following approach can be used.

In summary overview, the approach straightforwardly involves forming vias in a blank wafer at the locations where they should be relative to devices that would be on the wafer once front end processing is complete, making the vias electrically conductive and then fabricating the devices on the wafer, thereby making the connections between the devices and the through-chip connections by virtue of the device fabrication process.

Specifically, the process starts with a blank wafer, for example, a silicon (Si), germanium (Ge), silicon-germanium (SiGe), gallium-arsenide (GaAs), indium phosphide (InP) or other wafer.

Figure 1:
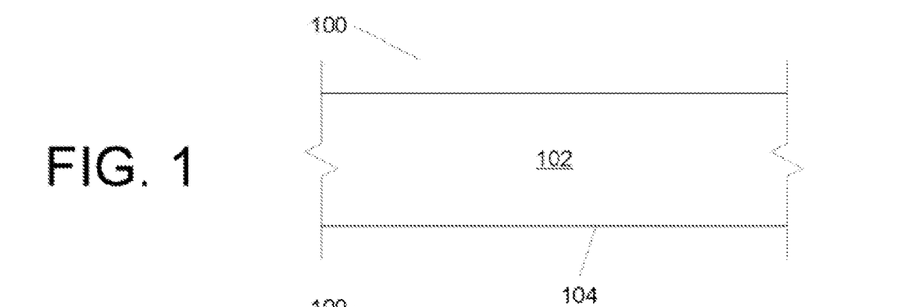
FIG. 1 illustrates, in simplified form, a portion of a blank wafer which will be used to illustrate the process.

FIG. 1 illustrates, in simplified form, a cross section of a portion 100 of a blank wafer 102 which will be used to illustrate the process. Note that scales are grossly distorted for simplicity of presentation.

Next, vias are formed in the wafer at pre-selected locations on the wafer that correspond to where they would be made if the devices had already been formed. Depending upon the particular implementation this can involve formation of the vias using, for example, one of the techniques described in the above-incorporated applications. Alternatively, or additionally, vias can be formed by other processes including, for example, laser drilling.

Figure 2:
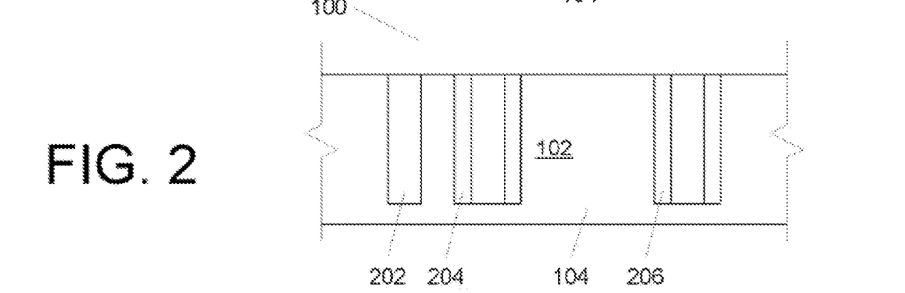
FIG. 2 illustrates, in simplified form, the portion of the wafer of FIG. 1 after formation of the vias.

FIG. 2 illustrates, in simplified form, the portion 100 of the blank wafer 102 after formation of the vias 202, 204, 206. As shown, the vias in the portion include one simple via 202 and two annular vias 204, 206. Note that, because annular vias are used, the vias do not extend completely through the wafer, but rather stop a short distance from the bottom surface 104 of the wafer to prevent the central post from falling out.

Once the vias have been formed, they are made electrically conductive by filling them with a conductor that can withstand the temperatures and stresses involved in the particular front end processing steps and specifically, device creation. For example, if CMOS processing will be performed, the conductor could be any of Au, Cu, Ni, W, Ti or any other metal or alloy that can withstand the temperatures involved in the CMOS processing. Optionally, the via can be coated with a layer of dielectric or insulator before filling with the conductor to prevent or insure that the conductor does not short to the substrate.

Depending upon the particular implementation, this can involve filling the vias using a vapor deposition process, a plating process or any other process which will result in filling of the vias. Alternatively, if an annular via process is used, the annular vias can be filled with a suitably robust insulator and the central posts can be left intact (i.e. not removed) so that, during front end processing, the central posts can be suitably doped and thereby act as the conductor itself and eliminating the need for any metal at all in such vias.

Figure 3:
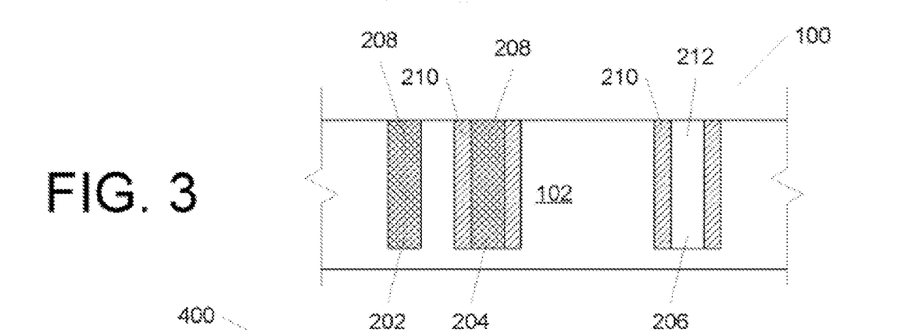
FIG. 3 illustrates, in simplified form, the vias of FIG. 2 after the simple via and one of the annular vias has been filled with metal.

FIG. 3 illustrates, in simplified form, the vias 202, 204, 206 of FIG. 2 after the simple via 202 has been filled with metal 208 and one of the annular vias 202 (which has had its central post removed) and the space left by the removal has also been filled with metal 208. Note that both of the annular vias 204, 206 have been filled with a suitable insulator 210. However, the central post 212 within the second annular via 206 has not been removed so that it can become a conductor during front end processing.

In the case where annular vias have been used, the bottom surface 104 of the wafer can now be thinned to expose the conductor metal 208 or the bottom of a central post 212. As will be recognized, this thinning will not have an effect on the via 206 where the central post 212 was retained because the insulator 210 holds it in place. Of course, if annular vias are not used, the via can extend through the wafer or not as desired, bearing in mind that the latter case will likely require thinning unless, for example, capacitive connections are contemplated.

In another alternative variant, the vias will not extend fully through the wafer, and the region between the bottom of the wafer and the via is maintained at sufficient dimensions so that it can become the device region during front end processing.

At this point, the processing of the instant approach is finished and the wafer now contains a full set of conductive, vias.

Thereafter, the wafer can undergo the normal front end and back-end processing and dicing in the conventional manner. Once that processing is complete, the final chip will have the same kind of through-chip connections as it could have had by performing one of the above-incorporated approaches on a fully processed chip but at a much lower risk and, potentially, with a higher yield.

Figure 4:
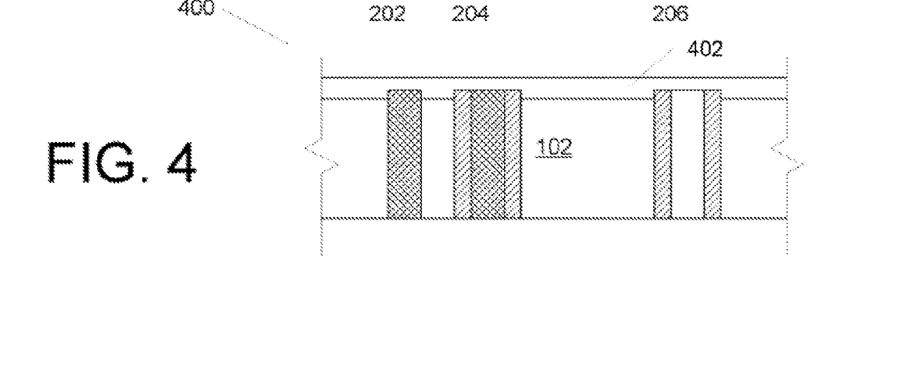
FIG. 4 illustrates, in simplified form, the portion of the wafer of FIG. 1 after front end processing is complete.

FIG. 4 illustrates, in simplified form, the portion of the wafer of FIG. 1 after front end processing is complete. Thus, as shown in FIG. 4, the wafer has become a front-end processed wafer 400 and now includes a doped region 402 where devices can be present. Advantageously, the vias, by virtue of their location relative to the devices, are now electrically connected to the appropriate parts of the devices.

In cases where transistors will be formed that may be very sensitive to processing and need flat and extremely defect-free areas and thus, must be formed without the risk of contamination that could occur during via formation, the following approach can be used.

In summary overview, the approach straightforwardly involves forming devices on the wafer until front end processing is complete, but before one or more phases of the back end processing begins, forming vias in the front-end processed wafers, making the vias electrically conductive and then performing one or more additional back-end processing phases.

Figure 5:
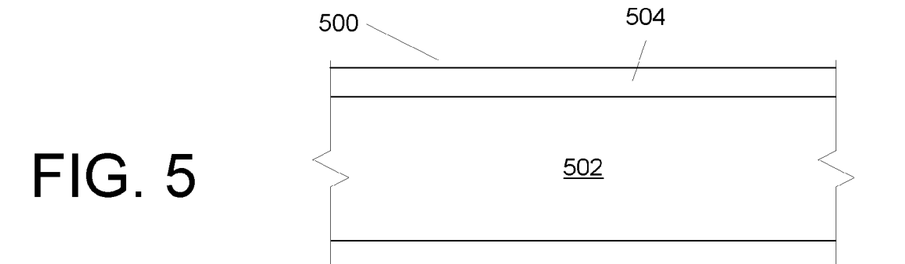
FIG. 5 illustrates, in simplified form, a portion of a front end processed wafer which will be used to illustrate the alternative process.

FIG. 5 illustrates, in simplified form, a portion 500 of a front end processed wafer 502 which will be used to illustrate the alternative process. As shown, the wafer 502 contains formed devices in the doped region 504. However, at this point, back-end processing to add metal interconnect layers has not occurred.

Next, vias are formed in the wafer at the appropriate locations for either connecting to or avoiding the devices. Depending upon the particular implementation this can involve formation of the vias using, for example, one of the techniques described in the above-incorporated applications. Alternatively, or additionally, vias can be formed by other processes including, for example, laser drilling.

Figure 6:
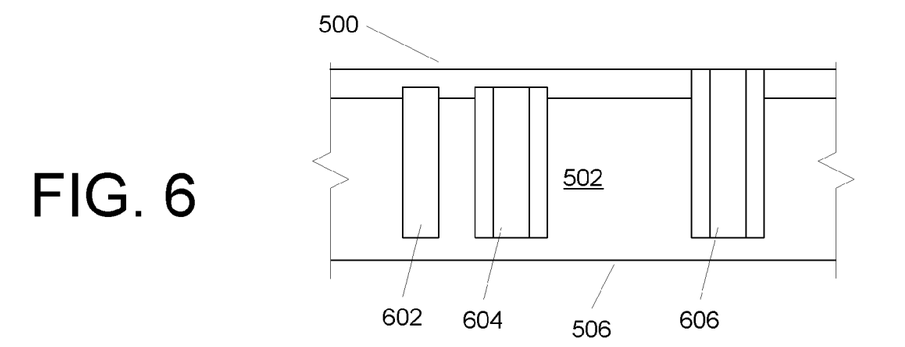
FIG. 6 illustrates, in simplified form, the portion of the front end processed wafer after formation of the vias.

FIG. 6 illustrates, in simplified form, the portion 500 of the front end processed wafer 502 after formation of the vias 602, 604, 606. As shown, the vias in the portion 500 include one simple via 602 (which may or may not contain the optional dielectric or insulator coating) and two annular vias 604, 606. Note that, because annular vias are used, the vias do not extend completely through the wafer 502, but rather stop a short distance from the bottom surface 506 of the wafer 502 to prevent the central post from falling out.

Once the vias have been formed, they are made electrically conductive by filling them with a conductive fill material. Depending upon the particular implementation, this can involve filling the vias using a vapor deposition process, a plating process or any other process which will result in filling of the vias. Depending upon the particular implementation, the via fill can be the same material as will be used for the metal layer(s) that will be formed, for example aluminum, tungsten or copper, it can be a different material than will be used for formation of the metal layer, for example, gold, silver or nickel, or, in the case where a connection is directly made to a device, a material matching the particular portion of the device to which the via reaches and it will attach, for example, using a polysilicon that matches the gate material of a field effect transistor.

Figure 7:
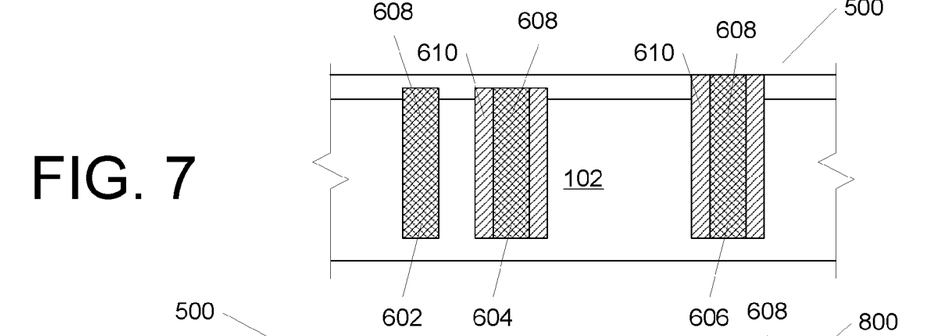
FIG. 7 illustrates, in simplified form, the vias of FIG. 6 after they have been filled with the desired electrically conductive filler material.

FIG. 7 illustrates, in simplified form, the vias 602, 604, 606 of FIG. 6 after they have been filled with the desired electrically conductive filler material 608. Note that, as shown and prior to filling with the conductor, annular vias have been filled with a suitable insulator 610 and the central posts of each of the annular vias 604, 606 have been removed.

In cases where annular vias are used, the bottom surface 506 of the wafer 502 can now be thinned to expose the electrically conductive filler material 608. Alternatively, the thinning (if needed) can occur at some point thereafter.

Next, the back-end processing can begin by laying down the first back-end connection layer (referred to herein as the "metal-1" layer).

Figure 8:
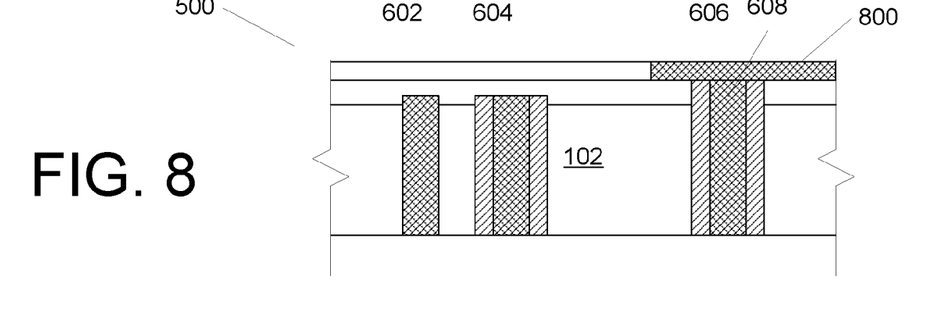
FIG. 8 illustrates, in simplified form, the configuration of FIG. 7 after the metal-1 layer has been added during back-end processing.

FIG. 8 illustrates, in simplified form, the configuration of FIG. 7 after the metal-1 layer 800 has been added during back-end processing.

Advantageously, by using this approach, the conductive filler material 608 of a given via can connect directly to the metal-1 layer 800, or not, as desired, in the former case, this could simply occur by depositing the metal-1 layer 800 so that a portion of the metal-1 layer 800 directly contacts and overlays the conductive filler material 608 of a via such as shown in FIG. 8.

Alternatively, and advantageously, in one example implementation, the formation of the metal-1 layer can occur as part of the via filling process, for example, if a plating process is used. With this approach, the wafer will be patterned with both the routing for the metal-1 layer 800 and the vias to be filled exposed. Thereafter, a seed layer is applied to facilitate plating and then plating occurs. In this manner, the plating "overburden" that forms wherever the seed is, will inherently form the metal-1 layer 800. Moreover, through selective patterning, particular vias can be extended "upwards" through the metallization layers, as needed, to connect to one or more particular metallization layers (e.g. any of metal-2 through metal-N, where "N" is the outermost layer).

A further advantageous alternative variant approach can be used, where connections must be made to one or more of the metal-2 through metal-N layers. This variant approach is similar to the immediately preceding approach except that a photoresist can be used to pattern the overburden. One type of photoresist that can be used is a "solid" photoresist that can be used to selectively cover certain vias so that, although all of the vias are formed in the wafer, only those that will connect to the metal-1 layer are left exposed for the first round of plating. Suitable "solid" photoresist materials include, by way of non limiting example, the Riston® dry film photoresist line, commercially available from E. I. du Pont de Nemours & Co, or other similar photoresists that are available in sheets of appropriate thickness. Specifically, with respect to the Riston® dry film photoresist line, the Riston® PlateMaster, EtchMaster and TentMaster lines of photoresist can be used. The advantage of a photoresist product like Riston®, is that it can be placed on the surface as sheets and it has rigidity. This rigidity means that it can be patterned in such a way that it can cover a via in a way that allows it to be easily re-exposed at a later point in time. Alternatively, if the unintentional via filling is not an issue for any of a number of reasons, a conventional non-solid or viscous photoresist can be used. FIGS. 9A through 9D illustrate the successive steps in a variant approach, involving use of a solid photoresist, performed on an example portion 900 of a wafer 902 that already has devices in a device region 904 thereon and has already had vias 906, 908, 910, 912 formed as described herein.

Through use and patterning of the solid photoresist 905, the filling of the vias 906 that will connect to the metal-1 layer with their conductive filler and the formation of the metal-1 layer occur concurrently (FIG. 9A) by plating with the conductive filler material 608 so that the plating "overburden" forms the metal-1 layer while the solid photoresist 905 prevents the other vias 908, 910, 912 from being filled by the conductive filler material 608 or the photoresist itself.

It should be noted that a certain level of planning will be necessary to ensure that no portion of a metallization layer runs over a via that will connect to a later metallization layer. If this cannot be avoided, then the via will need to be filled before its metallization and rerouted within one or more metallization layers. Advantageously, this does not present a major problem since part of the reason for the metallization being done in layers in the first place is rerouting.

Figure 9A:
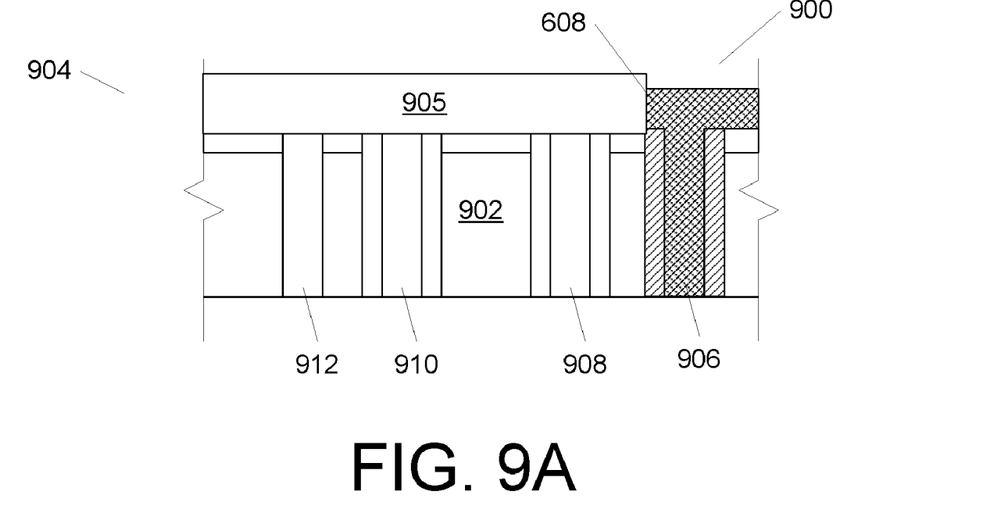
FIGS. 9A through 9D illustrate the successive steps in a variant approach.
Figure 9B:
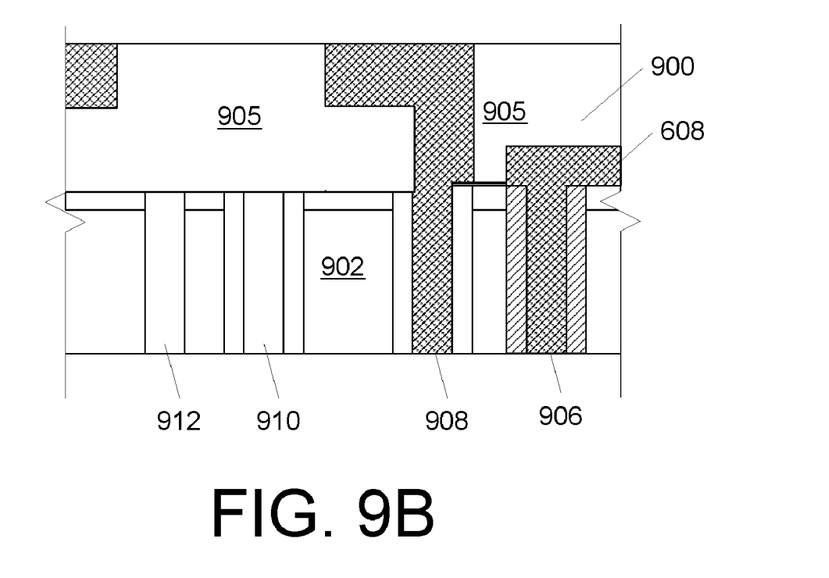
Figure 9C:
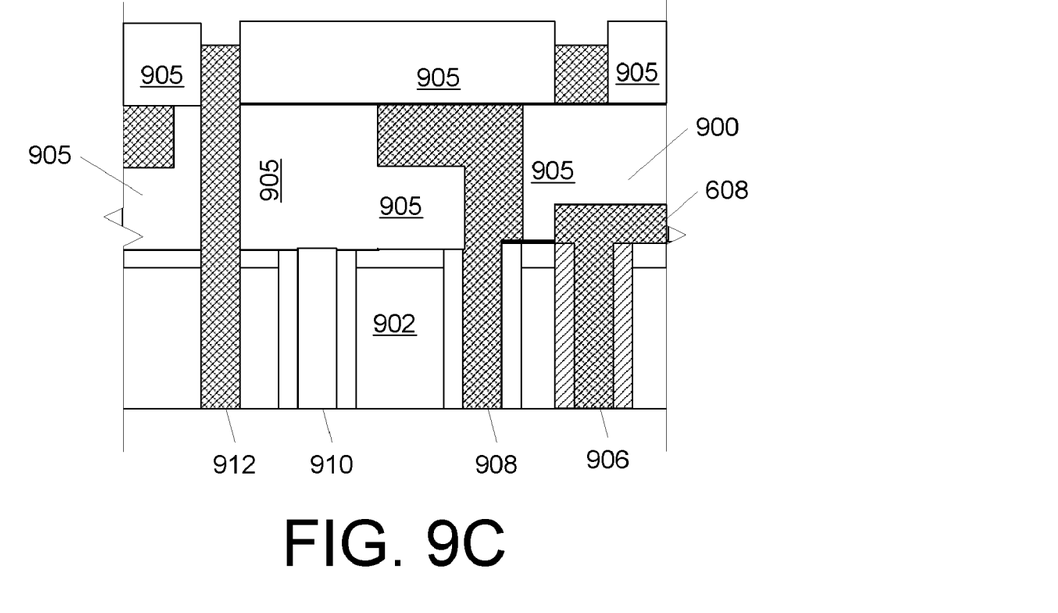
Figure 9D:
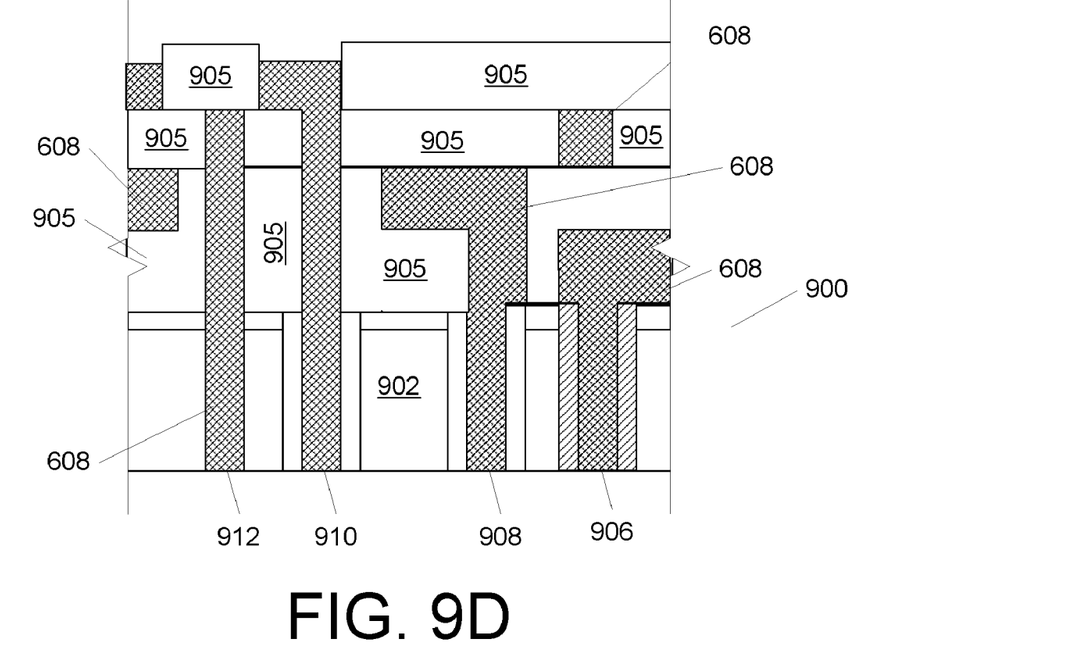

Returning to the approach, the first "solid" photoresist 905 layer is removed and a new "solid" photoresist 905 layer is applied to protect the metal-1 layer and vias 910, 912 that will connect to other layers and patterned to expose those vias 908 that will be filled concurrently with the formation of the metal-2 layer, a seed layer is applied and plating is performed to both fill the via and use the plating "overburden" as the metal-2 layer (FIG. 9B).

The approach is iteratively repeated for successive metallization layers (FIG. 9C, FIG. 9D) until all of the vias have been connected as needed, wherein conventional back-end processing can be used to form the remaining metallization layers (i.e. through metal-N). Notably, although current back-end processing can involve more than 10 to 12 layers (i.e. N=10, 11, 12 or more), the approach can advantageously be the same irrespective of the number of back-end layers ultimately needed.

Optionally, instead of etching and fabricating the vias just after the front end processing is complete, either of two alternative approaches can be used. In one alternative, the front end processing can be performed up to the point that a component of a device is added and then the via creation and fill could occur concurrently with creation of the component, for example, the vias can be etched and filled concurrently with the deposition of gate conductors (for the gates of transistors). In another alternative, the front end processing could be completed as above, but the back-end processing would be completed only until the metal-"X" layer (where N is the ultimate total number of layers for the completed integrated circuit chip and 1<X<N) and then the vias would be etched and filled up to that layer. Thereafter, the back-end processing would continue and, optionally, this process could be repeated after some additional number of layers, before the metal-N layer, are completed.

It should also be noted that the approaches herein also allow the back-end processing to be stopped at an intermediate point for device testing, for example, for simple functionality so that, if any given die is nonfunctional or the overall wafer has an insufficient yield, the processing can be halted or only continue on dies that pass this intermediate testing.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A method of processing a semiconductor wafer comprising:
   forming a plurality of vias in a semiconductor wafer;
   making at least some of the plurality of vias electrically conductive;
   forming a metallization layer over the plurality of vias using the same process used to make at least some of the plurality of vias electrically conductive;
   performing back-end processing on the semiconductor wafer after said forming a metallization layer; and
   performing intermediate device testing during said performing back-end processing.

2. The method of claim 1, wherein said making at least some of the plurality of vias electrically conductive comprises disposing one of a metal, a metal alloy, or a polysilicon material in a via.

3. The method of claim 1, wherein the semiconductor wafer is a blank wafer and the method further comprises forming devices on the semiconductor wafer after said forming a plurality of vias and said making at least some of the plurality of vias electrically conductive.

4. The method of claim 1, wherein said disposing is performed substantially concurrently with said forming a metallization layer.

5. The method of claim 4, wherein said disposing comprises:
   applying a solid photoresist to the semiconductor wafer;
   patterning the solid photoresist;
   applying a seed layer to areas exposed by said patterning; and
   plating the seed layer to dispose a plating material in the via and to form the metallization layer.

6. The method of claim 5, wherein said applying a solid photoresist comprises applying a solid photoresist over at least one via so that the via will not be filled with the plating material during said plating the seed layer.

7. The method of claim 1, wherein the metallization layer is an Nth metal layer, wherein N is an integer between 1 and 12.

8. The method of claim 7, further comprising filling a via subsequent to formation of at least one metallization layer.

9. The method of claim 1, wherein the semiconductor wafer is a device-bearing semiconductor wafer and the method further comprises performing back-end processing on the device-bearing semiconductor wafer after said making at least some of the plurality of vias electrically conductive.

10. The method of claim 9, wherein said performing back-end processing comprises forming a metal-X layer through a plating process, where X is an integer.

11. A method of processing a semiconductor wafer comprising:
   forming a plurality of vias in a semiconductor wafer;
   making at least some of the plurality of vias electrically conductive; and
   forming a metallization layer over the plurality of vias using the same process used to make at least some of the plurality of vias electrically conductive;
   wherein said forming a plurality of vias comprises forming an annular via.

12. The method of claim 11, wherein said forming an annular via comprises forming the annular via partially through the semiconductor wafer.

13. The method of claim 12, further comprising filling the annular via with an electrically conductive material.

14. The method of claim 13, further comprising removing a central post surrounded by the annular via.

15. The method of claim 12, wherein said making at least some of the plurality of vias electrically conductive comprises:
   filling the annular via with an insulator; and
   doping a central post surrounded by the annular via to make the central post electrically conductive.

16. The method of claim 15, wherein said doping is performed in a front-end process, the method further comprising removing a bottom portion of the semiconductor wafer.

17. A method of processing a device-bearing semiconductor wafer comprising:
   forming a plurality of vias in the device-bearing semiconductor wafer;
   making at least some of the plurality of vias electrically conductive;
   forming a metallization layer over the plurality of vias using the same process used to make at least some of the plurality of vias electrically conductive;
   performing back-end processing on the device-bearing semiconductor wafer after said making at least some of the plurality of vias electrically conductive; and
   stopping said performing back-end processing for intermediate device testing.

* * * * *